(12) United States Patent
Matsumoto et al.

(10) Patent No.: US 9,266,146 B2
(45) Date of Patent: Feb. 23, 2016

(54) FILM FORMING METHOD AND PROCESSING SYSTEM

(75) Inventors: Kenji Matsumoto, Yamanashi (JP); Shigetoshi Hosaka, Yamanashi (JP); Hitoshi Itoh, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 272 days.

(21) Appl. No.: 13/807,079

(22) PCT Filed: Jun. 24, 2011

(86) PCT No.: PCT/JP2011/064572
§ 371 (c)(1),
(2), (4) Date: Feb. 7, 2013

(87) PCT Pub. No.: WO2012/002282
PCT Pub. Date: Jan. 5, 2012

(65) Prior Publication Data
US 2013/0136859 A1    May 30, 2013

(30) Foreign Application Priority Data
Jun. 28, 2010    (JP) .................................. 2010-146880

(51) Int. Cl.
| | |
|---|---|
| C23C 16/00 | (2006.01) |
| B05D 5/12 | (2006.01) |
| C23C 16/40 | (2006.01) |
| H01L 21/768 | (2006.01) |
| H01L 23/532 | (2006.01) |

(52) U.S. Cl.
CPC . *B05D 5/12* (2013.01); *C23C 16/40* (2013.01); *H01L 21/76831* (2013.01); *H01L 21/76846* (2013.01); *H01L 21/76856* (2013.01); *H01L 21/76861* (2013.01); *H01L 21/76867* (2013.01); *H01L 21/76873* (2013.01); *H01L 23/5329* (2013.01); *H01L 23/53238* (2013.01); *H01L 2924/0002* (2013.01); *H01L 2924/09701* (2013.01)

(58) Field of Classification Search
CPC ................................. C23C 14/08; C23C 16/40
USPC ................................................ 427/250, 248.1
See application file for complete search history.

(56) References Cited

U.S. PATENT DOCUMENTS

| | | |
|---|---|---|
| 6,008,127 A | 12/1999 | Yamada |
| 2005/0218519 A1 | 10/2005 | Koike et al. |
| 2006/0037858 A1 | 2/2006 | Marumo et al. |

(Continued)

FOREIGN PATENT DOCUMENTS

| | | |
|---|---|---|
| JP | 10-189730 A | 7/1998 |
| JP | 2004-107747 A | 4/2004 |

(Continued)

OTHER PUBLICATIONS

International Search Report mailed Sep. 20, 2011 in PCT/JP2011/064572 filed Jun. 24, 2011.

*Primary Examiner* — Kelly M Gambetta
(74) *Attorney, Agent, or Firm* — Rothwell, Figg, Ernst & Manbeck, P.C.

(57) ABSTRACT

A film forming method performs a film forming process on a target object having on a surface thereof an insulating layer. The film forming method includes a first thin film forming step of forming a first thin film containing a first metal, an oxidation step of forming an oxide film by oxidizing the first thin film, and a second thin film forming step of forming a second thin film containing a second metal on the oxide film.

30 Claims, 10 Drawing Sheets

(56) References Cited

U.S. PATENT DOCUMENTS

| | | | |
|---|---|---|---|
| 2008/0179747 A1* | 7/2008 | Sakai et al. | 257/751 |
| 2010/0155951 A1 | 6/2010 | Koike et al. | |
| 2010/0233876 A1 | 9/2010 | Matsumoto et al. | |
| 2011/0049718 A1* | 3/2011 | Matsumoto et al. | 257/751 |
| 2011/0266676 A1* | 11/2011 | Isobayashi | 257/751 |

FOREIGN PATENT DOCUMENTS

| | | |
|---|---|---|
| JP | 2005-277390 A | 10/2005 |
| JP | 2008-13848 A | 1/2008 |
| JP | 2008-187072 A | 8/2008 |
| JP | 2009-206472 A | 9/2009 |
| JP | 4415100 B1 | 12/2009 |

* cited by examiner

FIG.4B
FORMING FIRST THIN FILM

FIG.4C
OXIDATION

FIG.4D

FORMING SECOND THIN FILM

FIG.4E

FORMING Cu

FIG. 7C
*Prior Art* though the material having a low relative permittivity such as the low-k film (SiOC) is used as the interlayer insulating film, a $MnO_x$ film is hardly formed on a surface of the interlayer insulating film having a low relative permittivity as well as an exposed surface in the recess even if a process for forming a Mn-containing film is performed by CVD. Thus, a barrier layer cannot be formed thereon.

SUMMARY OF THE INVENTION

In view of the above, it is an object of the present invention to provide a film forming method and a processing system which are capable of efficiently forming a thin film containing

US 9,266,146 B2

1

FILM FORMING METHOD AND PROCESSING SYSTEM

CROSS REFERENCE TO RELATED APPLICATION

This application is a 35 U.S.C. 371 National Phase Entry Application from PCT/JP2011/064572, filed Jun. 24, 2011, which claims the benefit of Japanese Patent Application No. 2010-146880 filed on Jun. 28, 2010, the disclosures of which are incorporated herein in their entirety by reference.

FIELD OF THE INVENTION

The present invention relates to a film forming method and a processing system used for forming wiring by burying copper in a recess in an interlayer insulating film having a low relative dielectric constant which is formed on a target object such as a semiconductor wafer or the like.

BACKGROUND OF THE INVENTION

Generally, desired semiconductor devices are manufactured by repetitively performing various processes such as film formation, pattern etching and the like on a semiconductor wafer. Meanwhile, in order to meet demand for higher integration and higher miniaturization of semiconductor devices, a line width or a hole diameter is getting gradually miniaturized. As for a wiring material or a burying material to be buried in a recess such as a trench, a hole or the like, copper having a very low electrical resistance and a low price tends to be used to reduce an electrical resistance in accordance with the miniaturization of various dimensions (see Japanese Patent Application Publication No. 2004-107747). When copper is used for a wiring material or a burying material, generally, a tantalum (Ta) metal or a tantalum nitride (TaN) film or the like is used for a barrier layer.

In order to fill the recess with copper, first, a thin seed layer made of a copper film is formed on an entire wafer surface including an entire wall surface in the recess in a plasma sputtering apparatus. Next, the recess is completely filled with copper by performing a copper plating process on the entire wafer surface. Thereafter, a residual copper thin film on the wafer surface is removed by polishing such as a CMP (chemical mechanical polishing) process or the like.

Figure 7A:
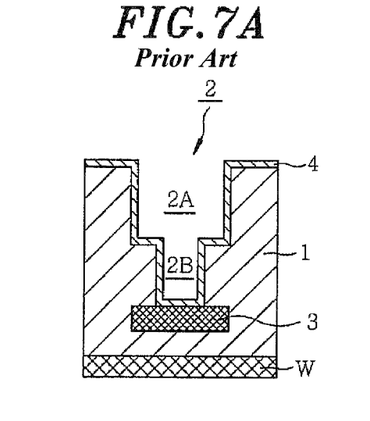
FIGS. 7A to 7C show a conventional process for filling a recess of a semiconductor wafer.
Figure 7B:
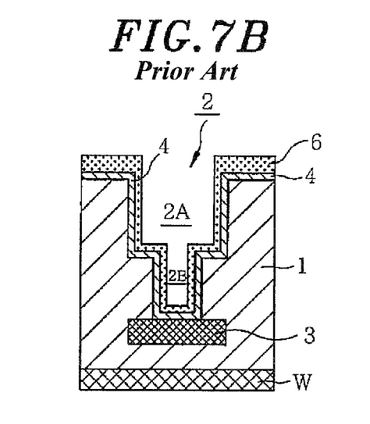
Figure 7C:
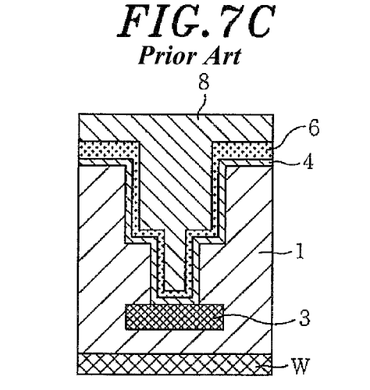

This will be described with reference to FIGS. 7A to 7C. FIGS. 7A to 7C show conventional processes for burying a recess of a semiconductor wafer. On a surface of an insulating layer 1 formed of an interlayer insulating film, e.g., an $SiO_2$ film, which is formed on the semiconductor wafer W, a recess 2 corresponding to, e.g., a via hole, a through hole or a groove (trench) is formed by a single damascene structure, a dual damascene structure, a three-dimension mounting structure or the like. Accordingly, a lower wiring layer 3 formed of a metal film, e.g., a copper film, is exposed at a bottom portion of the recess.

Specifically, the recess 2 includes a thin and long groove (trench) 2A having a recess-shaped cross section and a hole 2B formed at a part of a bottom portion of the groove 2A. The hole 2B is a via hole or a through hole. The wiring layer 3 is exposed to a bottom portion of the hole 2B, and is electrically connected to an underlying wiring layer or an element such as a transistor or the like. Illustration of the underlying wiring layer or the element such as the transistor or the like is omitted. The recess 2 has a very small width or inner diameter such as about 120 nm in order to meet a scaling-down requirement of a design rule. An aspect ratio thereof is required to be, e.g.,

2 about 2 to about 4. Illustration of a diffusion barrier layer and an etching stop film is omitted, and a simple shape is shown in the drawings.

On the surface of this semiconductor wafer W which includes the inner surface of the recess 2, a barrier layer 4 including, e.g., a TaN film and a Ta film in a laminated structure is substantially uniformly pre-formed by a plasma sputtering apparatus (see FIG. 7A). Then, a seed film 6, made of a thin copper film, as a metal film is formed over the entire surface of the wafer including the inner surface of the recess 2 by the plasma sputtering apparatus (see FIG. 7B). By performing a copper plating process on the surface of the wafer, the inside of the recess 2 is filled with a metal film 8 such as a copper film (see FIG. 7C). Thereafter, remnants of the metal film 8, the seed film 6 and the barrier layer 4 on the wafer surface are polished and removed by the CMP or the like.

In order to increase reliability of the barrier layer, various developments have been made. Particularly, attention is given to a self-forming barrier layer using a Mn film or a CuMn alloy film instead of using the Ta film or the TaN film (see Japanese Patent Application Publication No. 2005-277390). The Mn film or the CuMn alloy film is formed by sputtering. Further, the Mn film or the CuMn alloy film itself serves as a seed film. Thus, a Cu plating layer can be directly formed thereon. Moreover, by performing annealing after the plating, the Mn film or the CuMn alloy film reacts with a $SiO_2$ layer as an underlying insulating film by self-alignment. Accordingly, a $MnSi_xO_y$ film (x, y: a positive number) or a manganese oxide ($MnO_x$) film (x: a positive number) formed by a reaction between Mn and oxygen in the $SiO_2$ layer is formed as a barrier layer at a boundary between the $SiO_2$ layer and the Mn film or between the $SiO_2$ layer and the CuMn alloy film. As a result, the number of processes can be reduced. The manganese oxide includes, e.g., $MnO$, $Mn_3O_4$, $Mn_2O_3$, and $MnO_2$ depending on a valency of Mn. In this specification, these oxides are generally referred to as "$MnO_x$". Furthermore, this will be applied to $TaO_x$ to be described later.

Further, there has been discussed that a $MnSi_xO_y$ film or a $MnO_x$ film is formed by a CVD method capable of forming a film having a fine line width or a fine hole diameter with a good step coverage as compared with the sputtering method (see Japanese Patent Application Publication No. 2008-013848).

Recently, in order to meet demand for a higher operation speed of semiconductor devices, the interlayer insulating film needs to have a lower relative permittivity. Due to this demand, there has been considered to use a low-k film formed of SiOC, SiCOH or the like containing an organic group, e.g., a methyl group or the like, and having a lower relative permittivity as a material of the interlayer insulating film, instead of a silicon oxide film made of TEOS. Here, the silicon oxide film formed by using the TEOS has a relative permittivity of about 4.1, whereas the low-k film made of SiOC has a relative permittivity of about 3.0.

However, when the material having a low relative permittivity such as the low-k film (SiOC) is used as the interlayer insulating film, a $MnO_x$ film is hardly formed on a surface of the interlayer insulating film having a low relative permittivity as well as an exposed surface in the recess even if a process for forming a Mn-containing film is performed by CVD. Thus, a barrier layer cannot be formed thereon.

SUMMARY OF THE INVENTION

In view of the above, it is an object of the present invention to provide a film forming method and a processing system which are capable of efficiently forming a thin film containing a metal such as Mn, e.g., an $MnO_x$ film, on a surface of an insulating layer having a low relative permittivity.

In accordance with a first aspect of the present invention, there is provided a film forming method for performing a film forming process on a target object having on a surface thereof an insulating layer, including: a first thin film forming step of forming a first thin film containing a first metal; an oxidation step of forming an oxide film by oxidizing the first thin film; and a second thin film forming step of forming a second thin film containing a second metal on the oxide film.

With such configuration, the second thin film containing a second metal such as Mn, e.g., an $MnO_x$ film, is easily formed on the surface of the insulating layer having a low relative permittivity, which is formed of a so-called low-k film.

In accordance with a second aspect of the present invention, there is provided a film forming method for performing a film forming process on a target object having on a surface thereof an insulating layer, including: an oxide film forming step of forming an oxide film containing a first metal; and a second thin film forming step of forming a second thin film containing a second metal on the oxide film.

With such configuration, the second thin film containing a second metal such as Mn, e.g., an $MnO_x$ film, is easily formed on the surface of the insulating layer having a low relative permittivity, which is formed of a so-called low-k film.

In accordance with a third aspect of the present invention, there is provided a film forming method for performing a film forming process on a target object having on a surface thereof an insulating layer, including: a first thin film forming step of forming a first thin film containing a first metal; an oxidation step of forming an oxide film by oxidizing the first thin film; a third film forming step of forming a third film containing Cu on the oxide film; and a second thin film forming step of forming a second thin film on an interface between the oxide film and the third film by supplying a source gas containing a second metal on the third film.

With such configuration, the second thin film, e.g., an $MnO_x$ film, is easily formed at a boundary between the first thin film and the third thin film by self-formation.

In accordance with a fourth aspect of the present invention, there is provided a film forming method for performing a film forming process on a target object having on a surface thereof an insulating layer, including: a step of forming an oxide film containing a first metal; a third film forming step of forming a third film containing Cu on the oxide film; and a second thin film forming step of forming a second thin film on an interface between the oxide film and the third film by supplying a source gas containing a second metal on the third film.

With such configuration, the second thin film, e.g., an $MnO_x$ film, is easily formed at a boundary between the first thin film and the third thin film by self-formation.

In accordance with a fifth aspect of the present invention, there is provided a film forming method for performing a film forming process on a target object having on a surface thereof an insulating layer, including: a first thin film forming step of forming a first thin film containing a first metal; a third film forming step of forming a third film containing Cu on the first thin film; and a second thin film forming step of forming a second thin film on an interface between the oxide film and the third film by supplying a source gas containing a second metal on the third film.

With such configuration, the second thin film, e.g., an $MnO_x$ film, is easily formed at a boundary between the first thin film and the third thin film by self-formation.

In accordance with a sixth aspect of the present invention, there is provided a processing system for forming a film on a target object having on a surface thereof an insulating layer, including: a processing apparatus for forming a first thin film containing a first metal on a surface of the target object; a processing apparatus for forming an oxide film by oxidizing the first thin film; a processing apparatus for forming a second thin film containing a second metal on the oxide film; a common transfer chamber connected to the processing apparatuses; a transfer unit, provided in the common transfer chamber, for transferring the target object into the processing apparatuses; and a system control unit configured to control the processing system to perform the film forming method described in accordance with the first aspect.

In accordance with a seventh aspect of the present invention, there is provided a processing system for forming a film on a target object having on a surface thereof an insulating layer, including: a processing apparatus for forming an oxide film containing a first metal on the surface of the target object; a processing apparatus for forming a second thin film containing a second metal on the oxide film; a common transfer chamber connected to the processing apparatuses; a transfer unit, provided in the common transfer chamber, for transferring the target object into the processing apparatuses; and a system control unit configured to control the processing system to perform the film forming method described in accordance with the second aspect.

According to the film forming method and the processing system of the present invention, the following outstanding effects can be realized.

According to the first and the second aspect of the present invention, the second thin film containing a second metal such as Mn, e.g., an $MnO_x$ film, is easily formed on the surface of the insulating layer having a low relative permittivity, which is formed of a so-called low-k film.

According to the third to fifth aspect of the present invention, the second thin film, e.g., an $MnO_x$ film, is easily formed at a boundary between the first thin film and the third thin film by self-formation.

DETAILED DESCRIPTION OF THE EMBODIMENTS

Hereinafter, embodiments of a film forming method and a processing system of the present invention will be described with reference to the accompanying drawings.

(Processing System)

Figure 1:
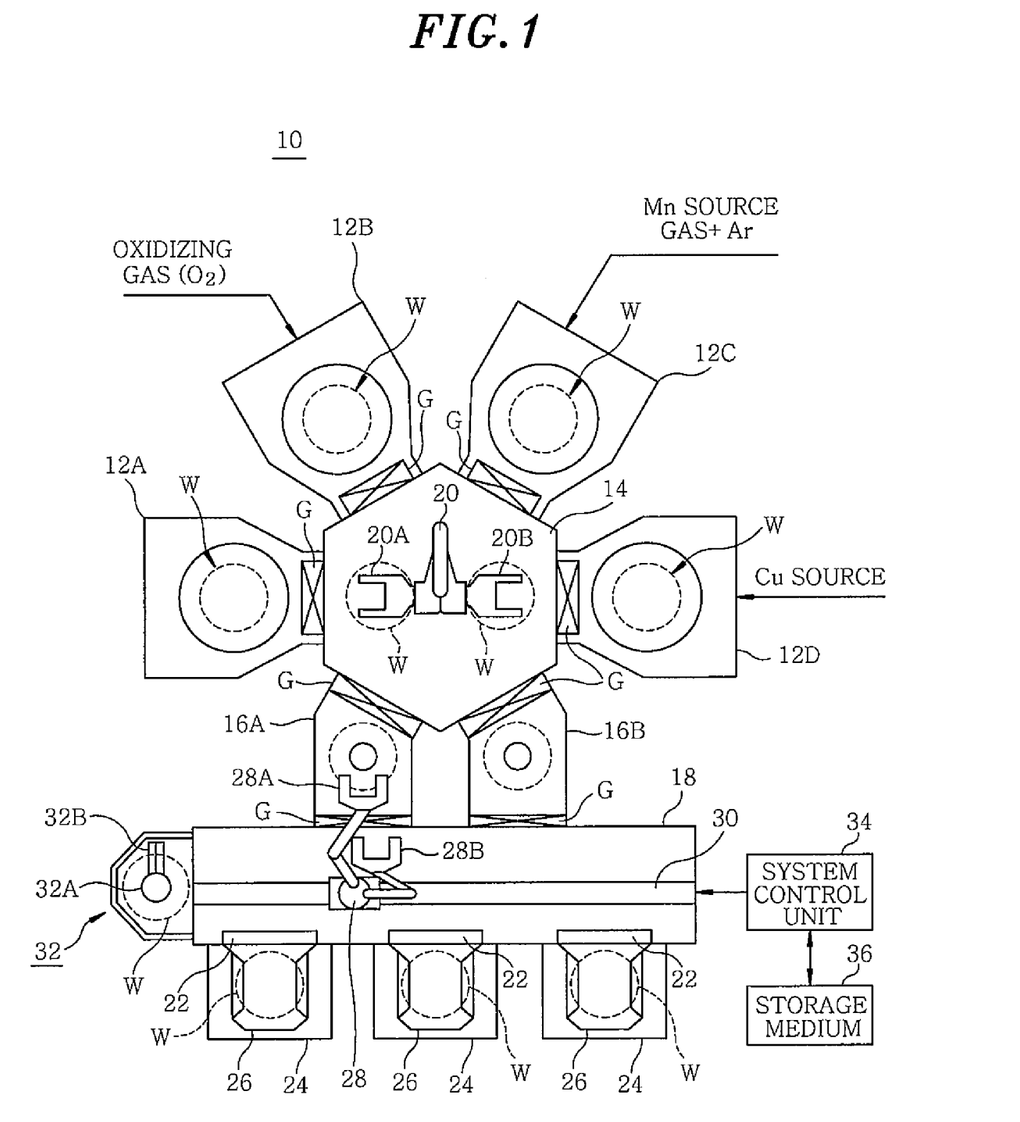
FIG. 1 is a schematic configuration diagram showing a processing system of the present invention.
Figure 2:
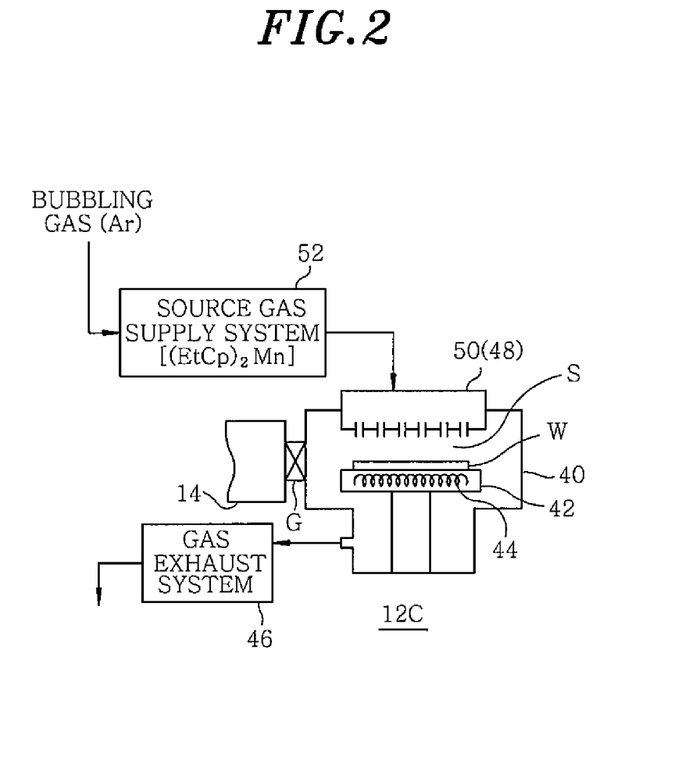
FIG. 2 is a schematic configuration diagram showing an example of a processing apparatus.

First, a processing system for performing a film forming method of the present invention will be explained. FIG. 1 is a schematic configuration diagram showing a processing system of the present invention, and FIG. 2 is a schematic configuration diagram showing an example of a processing apparatus of the present invention. Here, a case in which Ta is used as a first metal and Mn is used as a second metal will be described as an example.

As shown in FIG. 1, a processing system 10 includes, as main elements, a plurality of, e.g., four, processing apparatuses 12A to 12D and a substantially hexagonal common transfer chamber 14. The common transfer chamber 14 is connected to a first and a second load-lock chambers 16A and 16B, each having a load-lock function, and a thin and long introduction side transfer chamber 18 is connected to the first and second load-lock chambers 16A and 16B.

Here, a first processing apparatus, e.g., the processing apparatus 12A, of the four processing apparatuses 12A to 12D is configured to form a first thin film containing Ta as a first metal on a semiconductor wafer as a target object. A second processing apparatus, e.g., the processing apparatus 12B, is configured to form an oxide film by oxidizing the first thin film formed on the semiconductor wafer W. A third processing apparatus, e.g., the processing apparatus 12C, is configured to form a second film containing Mn as a second metal on the semiconductor wafer W. A fourth processing apparatus, e.g., the processing apparatus 12D, is configured to deposit a copper film containing a metal serving as a material of the filling material on the semiconductor wafer W.

The fourth processing apparatus 12D may not be provided in this processing system 10. Other processing apparatuses provided outside the processing system 10 may perform the processes of the fourth processing apparatus 12D. As for the fourth processing apparatus 12D, there is used a film forming apparatus for performing a CVD method, an ALD method, a PVD (sputtering) method, a supercritical $CO_2$ method, an electroless plating method, an electroplating method, a CVD-Cu seed and electroplating method, a sputtering Cu seed and electroplating method or the like.

Specifically, the processing apparatuses 12A to 12D are connected to four sides of the substantially hexagonal common transfer chamber 14. The first and the second load-lock chambers 16A and 16B are connected to the other two sides. Further, the first and the second load-lock chambers 16A and 16B are commonly connected to the introduction side transfer chamber 18.

The common transfer chamber 14 is airtightly connected to each of the four processing apparatuses 12A to 12D and each of the first and the second load-lock chambers 16A and 16B via an openable/closable gate valve G. With this configuration, these components may serve as cluster tools. If necessary, the inside of the common transfer chamber 14 may communicate with the four processing apparatuses 12A to 12D and the first and the second load-lock chambers 16A and 16B. Here, the inside of the common transfer chamber 14 is vacuum-exhausted. Further, the introduction side transfer chamber 18 is airtightly connected to each of the first and the second load-lock chambers 16A and 16B via an openable/closable gate valve G. The first and the second load-lock chambers 16A and 16B are repeatedly switched between a vacuum state and an atmospheric state in accordance with the loading and unloading of the wafer.

Within the common transfer chamber 14, a transfer device 20 having a multi-joint arm capable of extending, contracting and rotating is provided at a position accessible to each of the two load-lock chambers 16A and 16B and the four processing apparatuses 12A to 12D. The transfer device 20 has two picks 20A and 20B capable of independently extending and contracting in opposite directions. Therefore, the transfer device 20 may handle two wafers at a time.

The introduction side transfer chamber 18 is formed in a longitudinally elongated box shape. On one longitudinal side of the introduction side transfer chamber 18, one or more, e.g., three in the drawing, loading ports are provided to introduce semiconductor wafers as target objects. Each of the loading ports is provided with an opening/closing door 22 capable of being opened and closed. An inlet port 24 is disposed so as to correspond to each of the loading ports. A single cassette container 26 is mounted on each of the inlet ports 24. Each of the cassette containers 26 accommodates a plurality of, e.g., twenty five, wafers W laminated in multiple layers with an equal pitch. The inside of the cassette container 26 is in, e.g., a sealed state and filled with an atmosphere of an inert gas such as an $N_2$ gas or the like.

Within the introduction side transfer chamber 18, an introduction side transfer unit 28 for transferring the wafer W in a longitudinal direction thereof is provided. The introduction side transfer unit 28 has two picks 28A and 28B capable of extending, contracting and rotating. Hence, the introduction side transfer unit 28 handles two wafers W at a time. Within the introduction side transfer chamber 18, the introduction side transfer unit 28 is supported so as to be slidable on a guide rail 30 extending along the longitudinal direction thereof.

An orienter 32 for position alignment of the wafer is provided at one end of the introduction side transfer chamber 18. The orienter 32 has a rotatable table 32A rotated by a driving motor, and the wafer W is mounted and rotated thereon. An optical sensor 32B for detecting a peripheral portion of the wafer W is arranged at an outer periphery of the rotatable table 32A. Accordingly, a position of a positioning cutout, e.g., a notch or an orientation flat, of the wafer W, or a positional misalignment amount of a center of the wafer W may be detected.

Hereinafter, among the processing apparatus, the third processing apparatus 12C for forming a second thin film containing Mn which is a main process will be described briefly. As shown in FIG. 2, the third processing apparatus 12C includes a processing chamber 40 that can be vacuum-evacuated. The processing chamber 40 includes an upper space having a large diameter and a lower space having a small diameter. A mounting table 42 is uprightly installed on the bottom portion of the processing chamber 40 and mounts thereon a semiconductor wafer W. The mounting table has therein a heating unit 44 formed of, e.g., a resistance heater, so that the wafer W can be heated. Further, a gas exhaust system 46 is connected to the bottom portion of the processing chamber 40 and thus can vacuum-evacuate the atmosphere in the processing chamber 40 while controlling a pressure. The sidewall of the processing chamber 40 is connected to the common transfer chamber 14 via the gate valve G.

Moreover, the processing chamber 40 is provided with a gas introduction unit 48 for introducing a desired gas. Here, the gas introduction unit 48 serves as a shower head 50 that is provided at the ceiling portion of the processing chamber so as to face the mounting table 42 and is configured to inject a gas toward a processing space S positioned below the shower head 50. A source gas supply system 52 for supplying a source gas required for film formation is connected to the shower head 50 and thus can supply the source gas at a controlled flow rate.

Here, an organic metal material containing Mn is used for the source. Specifically, $(EtCp)_2Mn$ is used. This source is heated to a temperature at which a vapor pressure is high enough for supply. When the heating temperature exceeds a melting point, the source becomes liquid and then evaporates by a bubbling gas, e.g., Ar gas. The evaporated source is supplied together with the bubbling gas. The bubbling gas is not limited to Ar gas and may be another rare gas such as He gas or the like. Or, $H_2$ gas or $N_2$ gas may also be used.

Organic metal containing Mn may contain one or more compounds selected from a group consisting of:

$MnCp_2[=Mn(C_5H_5)_2]$;
$Mn(MeCp)_2[=Mn(CH_3C_5H_4)_2]$;
$Mn(Me_5Cp)_2[=Mn((CH_3)_5C_5H_4)_2]$;
$Mn(EtCp)_2[=Mn(C_2H_5C_5H_4)_2]$;
$Mn(i-PrCp)_2[=Mn(C_3H_7C_5H_4)_2]$;
$Mn(t-BuCp)_2[=Mn(C_4H_9C_5H_4)_2]$;
$MeCpMn(CO)_3[=(CH_3C_5H_4)Mn(CO)_3]$;
$CpMn(CO)_3[=(C_5H_5)Mn(CO)_3]$;
$MeMn(CO)_5[=(CH_3)Mn(CO)_5]$;
$Mn_2(CO)_{10}$;
$Mn(DPM)_2[=Mn(C_{11}H_{19}O_2)_2]$;
$Mn(DPM)_3[=Mn(C_{11}H_{19}O_2)_3]$;
$Mn(DMPD)(Etcp)[=Mn(C_7H_{11}C_2H_5C_5H_4)]$;
$Mn(acac)_2[=Mn(C_5H_7O_2)_2]$;
$Mn(acac)_3[=Mn(C_5H_7O_2)_3]$;
$Mn(hfac)_2[=Mn(C_5HF_6O_2)_3]$;
$Mn(iPr-AMD)_2[=Mn(C_3H_7NC(CH_3)NC_3H_7)_2]$;
$Mn(tBu-AMD)_2[=Mn(C_4H_9NC(CH_3)NC_4H_9)_2]$; and
$Mn(AMD)_2[=Mn(C_3H_7NC(C_4H_9)NC_3H_7)_2]$.

By supplying the source gas, the second thin film containing Mn as a second metal, i.e., $MnO_x$ film, is formed on the wafer W.

The processing system 10 has a system control unit 34 having, e.g., a computer, for controlling the entire operation of the system. The program required to control the entire operation of the processing system is stored in a storage medium 36 such as a flexible disc, a CD (Compact Disc), a hard disc, a flash memory or the like. Specifically, operations including start and stop of gas supply of each gas, flow rate control, control of a processing temperature (a temperature of the wafer) and a processing pressure (a pressure in the processing chamber of each of the processing apparatuses), transferring of the wafer and the like are carried out in accordance with instructions from the system control unit 34.

Figure 3A:
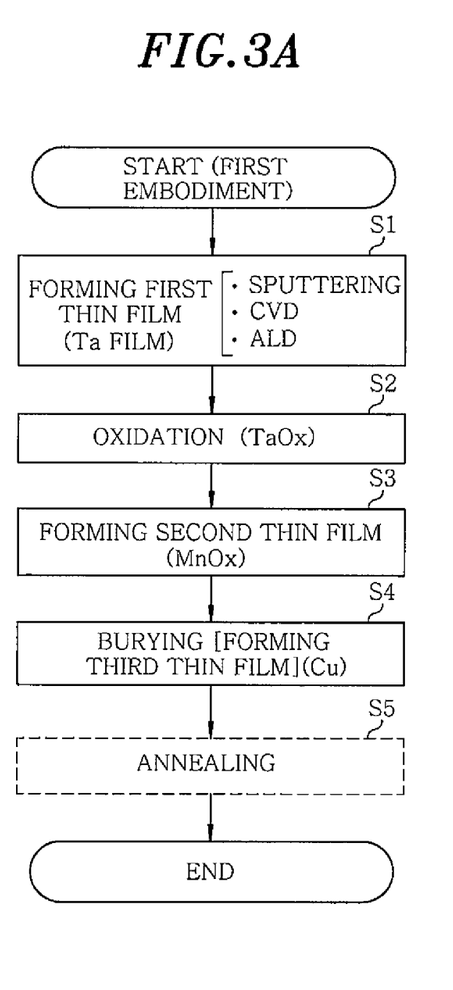
FIGS. 3A to 3E are flowcharts showing processes of the method of the present invention.
Figure 3B:
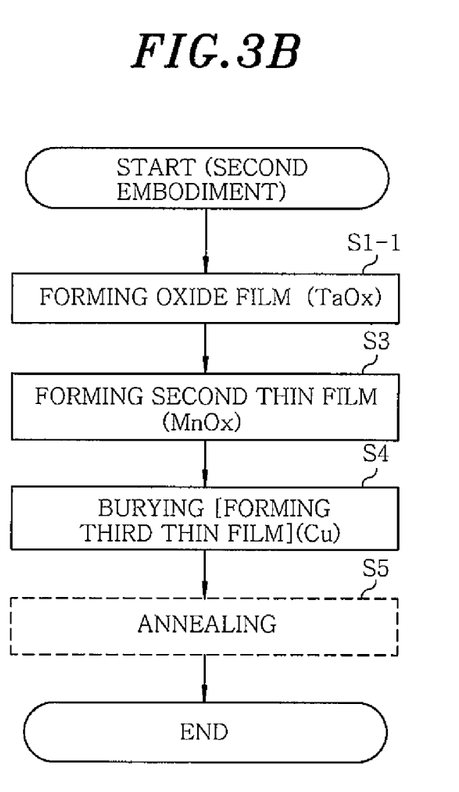

The film forming method, which is the schematic operation in the processing system 10 configured as described above, will be described with reference to FIGS. 3A to 3E and 4A to 4E. FIGS. 3A to 3E are flowcharts showing the steps of the film forming method. FIG. 3A shows a first embodiment of the film forming method. FIGS. 4A to 4E show examples of deposition state of the thin film in the respective steps of the first embodiment of the film forming method. First, an unprocessed semiconductor wafer W is introduced from a cassette container 26 installed at the inlet port 24 into the introduction side transfer chamber 18 by the introduction side transfer unit 28. The introduced wafer W is transferred to the orienter 32 disposed one end of the introduction side transfer chamber 18 and positioned by the orienter 32.

Figure 4A:
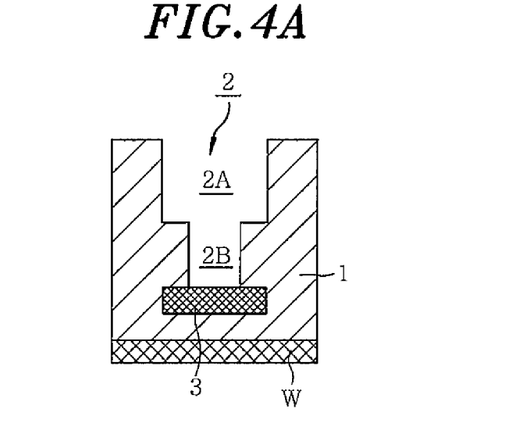
FIGS. 4A to 4E show an example of a forming status of a thin film in each process of a first embodiment of the method of the present invention.

When the wafer W is loaded into the processing system 10, a recess 2 such as a trench or a hole has been formed on a surface of an insulating layer 1, e.g., an interlayer insulating film or the like, formed on the wafer W, and a underlying wiring layer 3 as a metal layer, which is made of, e.g., copper, has been exposed at the bottom portion of the recess 2, as shown in FIG. 4A. The recess 2 includes a groove (trench) 2A having a long and thin cross section, and a hole 2B formed at a part of the bottom portion of the groove 2A. The hole 2B is a contact hole or a through hole. Further, the wiring layer 3 as a metal layer is exposed at the bottom portion of the hole 2B and electrically connected to an underlying wiring layer or a device such as a transistor or the like. The underlying wiring layer or the device such as a transistor or the like is not illustrated. The insulating layer 1 as a base film is a low-k film, e.g., SiOC, which has a low relative permittivity smaller than 4.1.

The wafer W that has been positioned as described above is transferred again by the introduction side transfer unit 28 and loaded into any one of the first and the second load-lock chamber 16A and 16B. After the load-lock chamber is vacuum-evacuated, the wafer W in the load-lock chamber is introduced into the common transfer chamber 14 that has been vacuum-evacuated in advance by the transfer unit 20 in the common transfer chamber 14.

In the first embodiment of the method of the present invention (see FIG. 3A), the unprocessed wafer loaded into the common transfer chamber 14 is firstly loaded into the first processing apparatus 12A. In the first processing apparatus 12A, the wafer W is subjected to a first thin film forming step S1 in which a first thin film made of a Ta metal film is formed by, e.g., sputtering.

The wafer W on which the first thin film has been formed is loaded into the second processing apparatus 12B. In the second processing apparatus 12B, an oxidation step S2 in which an oxide film, i.e., $TaO_x$, is formed by oxidizing the first thin film on the surface of the wafer W is carried out.

The wafer W on which the oxide film has been formed is loaded into the third processing apparatus 12C. In the third processing apparatus 12C, a second thin film forming step S3 in which a second thin film containing a second metal is formed on the surface of the wafer W is carried out. The second metal serves as a barrier for an embedded metal in the recess. As for the second thin film, a $MnO_x$ film is formed, for example. In this manner, a barrier layer for a Cu film is formed in a structure of the first and the second thin film.

The wafer W that has been subjected to the second thin film is loaded into the fourth processing apparatus 12D. In the fourth processing apparatus 12D, a burying step S4 in which the recess 2 is buried by depositing an embedded metal, e.g., a Cu film, on the surface of the wafer W is performed as a third film forming step. Upon completion of the burying step, the processing in the processing system 10 is completed. The processed wafer W is accommodated in the cassette container 26 for processed wafer of the inlet port 24 via any one of the load-lock chambers 16A and 16B and the introduction side transfer chamber 18. The common transfer chamber 14 is depressurized in an atmosphere of a rare gas such as Ar, He, or the like, or an inert gas such as $N_2$ or the like.

Figure 4B:
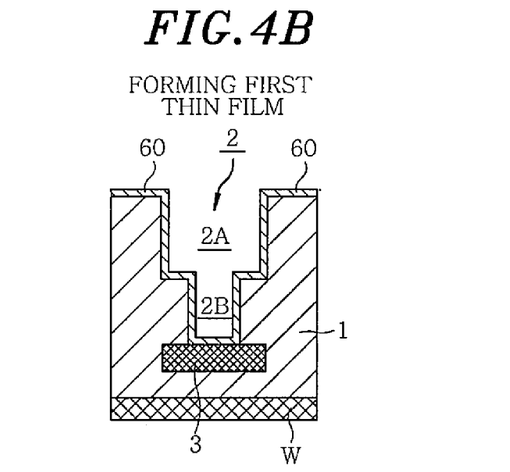

Hereinafter, each of the steps will be described in detail. First, the first processing apparatus 12A is configured as a sputtering apparatus. As for a metal target, Ta metal is used. In the first thin film forming step S1, a first thin film 60 is thinly formed on the surface of the wafer W having a state shown in FIG. 4A by sputtering as shown in FIG. 4B. Accordingly, the first thin film 60 is formed on the entire surface including the entire inner surface of the recess 2. As described above, the first thin film 60 is formed of a Ta metal film. If the film thickness is excessively thick, the amount of copper buried in the recess in a next process is reduced, which results in an increase in a wiring resistance or a contact resistance. To that end, it is preferable to set a film thickness of the first thin film 60 to about 2 nm or less.

In this example, the first thin film 60 is formed by sputtering. However, a CVD method or an ALD (Atomic Layer Deposition) method for forming a film by alternately supplying a source gas and a reduction gas may be used other than the above method.

Figure 4C:
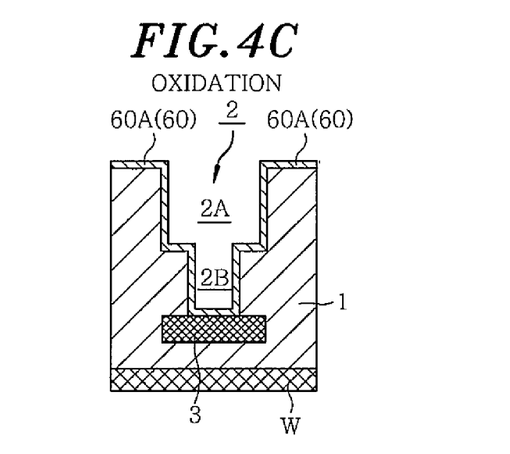

The second processing apparatus 12B is configured as, e.g., an annealing apparatus, and performs an oxidation process. In the oxidation step S2, the Ta metal film as the first thin film 60 is oxidized, so that the oxide film 60A, i.e., the $TaO_x$ film, is formed as shown in FIG. 4C. In that case, it is preferable to anneal the wafer W in an atmosphere of an oxidizing gas such as $O_2$ gas, ozone gas or vapor in a state where the wafer W is heated to a predetermined temperature, e.g., about 100° C. to 400° C. Here, $O_2$ gas is supplied.

The wafer W may be oxidized by heating while supplying a rare gas such as Ar gas or the like or an inert gas such as $N_2$ gas or the like without supplying an oxidizing gas. Or, the wafer W may be oxidized by annealing through heating without supplying any gas. In that case, moisture or oxygen contained in the insulating layer 1 reacts with the Ta metal film, thereby forming $TaO_x$ film as an oxide film 60A. In this case, the Ta metal film, which is in contact with the underlying wiring layer 3 which is made of, e.g., copper and exposed at the bottom portion of the recess 2 in a state shown in FIG. 4C, remains as a Ta film without being oxidized. Meanwhile, the Ta metal film, which is in contact with the insulating layer 1, is oxidized and becomes a $TaO_x$ film. Therefore, in the second thin film forming step, the $MnO_x$ film is formed at the portion other than the Ta metal film that is in contact with the wiring layer 3. In other words, the laminated structure of $MnO_x$/Ta is formed on the top surface of the insulating layer 1 or the sidewall of the groove (trench) 2A or the hole 2B. Meanwhile, only the Ta film is formed at the bottom portion of the hole 2B. Accordingly, it is expected that the wiring resistance (via resistance) through the hole can be reduced.

In addition, as an another oxidation method, in a state shown in FIG. 4B, i.e., in a state where the Ta metal film as the first thin film 60 is formed, the wafer W may be transferred to the outside of the processing system and exposed to the atmosphere so that the Ta metal film can be oxidized by oxygen or vapor in the atmosphere. Further, water may be adsorbed on the surface of the first metal-containing oxide film 60A formed through the oxidation step S2. The water may be obtained by supplying water into a separate chamber, or from moisture discharged from the heated insulating film 1 or from vapor in the atmosphere.

Figure 4D:
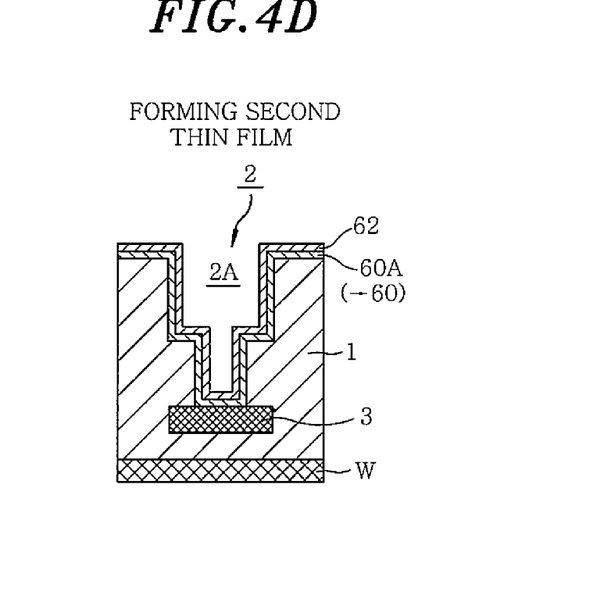

As described above, the third processing apparatus 12C is configured as shown in FIG. 2. In the second thin film forming step S3, the second thin film 62 containing Mn as a second metal, i.e., $MnO_x$ film, is formed on the oxide film 60A as shown in FIG. 4D. Specifically, the wafer W mounted on the mounting table 42 is heated to a temperature ranging from about 100° C. to 400° C., e.g., about 200° C., in the processing chamber 40. The Mn source gas is generated by vaporizing a source material by using a bubbling gas in the source gas supply system 52 and, then, the source gas thus obtained is supplied to the processing space S in the processing chamber 40 from the shower head 50. The processing pressure is within the range from about 1 Pa to $10^5$ Pa, e.g., about 133 Pa. The flow rate of the Mn source gas is within the range from about 0.1 sccm to 10 sccm, and the flow rate of the carrier gas is within the range from about 10 sccm to 500 sccm. Here, the source gas is supplied to the processing chamber 40 together with the bubbling gas.

Accordingly, when the Mn source gas or the Mn metal is attached to the $TaO_x$ film as the oxide film 60A by CVD, the source gas of Mn or the Mn metal immediately reacts with the oxygen of the $TaO_x$ film and/or water physically adsorbed on the surface, thereby forming a $MnO_x$ film as the second thin film 62. In that case, the oxide film 60A is reduced and returned to the Ta metal film 60 (first thin film). Since the surface of the insulating film 1 is hydrophobic, the sticking probability of the Mn source gas or water having a function of decomposing the Mn source gas is considerably reduced, which results in deterioration of formation of the Mn film or the $MnO_x$ film. However, by forming a $TaO_x$ film on the insulating film 1 in advance, the hydrophobic surface on the substrate surface is covered by the $TaO_x$ film and becomes a hydrophilic surface. Hence, the Mn source gas is easily attached to the surface, and the source gas attached to the surface is decomposed or oxidized. Accordingly, the Mn metal film is temporarily deposited, but the metal Mn is immediately oxidized. As a result, a $MnO_x$ film is immediately formed.

When the $MnO_x$ film is formed on the surface of the wafer, the $TaO_x$ film as the oxide film 60A is formed as a base. Thus, the $MnO_x$ film is easily attached or deposited. Here, the $MnO_x$ film can be easily formed. In one case, the source gas of the second metal which is adhered to the surface of the wafer W, e.g., the Mn source gas, needs to react on the surface of the oxide film as a base. Therefore, water is physically adsorbed on the surface of the oxide film. In another case, the metal Mn deposited on the surface of the wafer W needs to be oxidized by eliminating oxygen from the oxide film as a base. Therefore, the metals are selected such that the standard formation free energy of the first metal, e.g., the Cu-containing metal oxide ($Cu_xO$), is equal to or greater than the standard formation free energy of the second metal, i.e., the Mn-containing metal oxide ($MnO_x$).

In this manner, the barrier layer having a two-layer structure of the first and the second thin film 60 and 62 is formed. In still another case, the second metal deposited on the surface of the wafer W, e.g., Mn, needs to be oxidized by obtaining oxygen from water physically absorbed on the surface of the oxide film as a base. Therefore, the metals are selected such that the standard formation free energy of the second metal, e.g., the Mn-containing metal oxide ($MnO_x$), is equal to or smaller than the standard formation free energy of the physically absorbed water ($H_2O$). As a consequence, the barrier layer having a two-layer structure including the first and the second thin film 60 and 62 is formed.

Figure 4E:
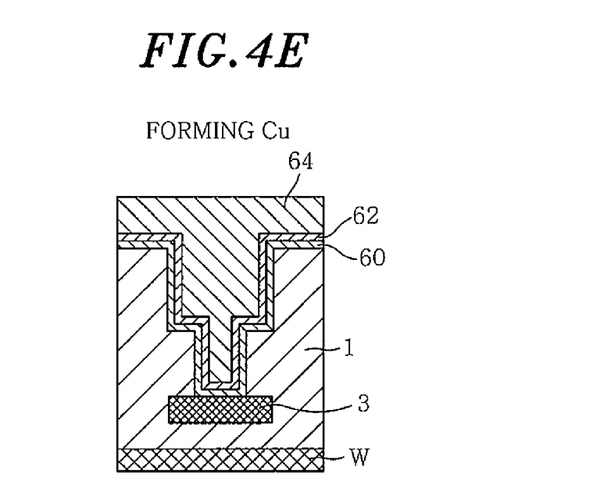

In the fourth processing apparatus 12D, as shown in FIG. 4E, the recess 2 is buried by the embedded metal 64 by performing the embedding step S4. Accordingly, the recess 2 is completely buried and the embedded metal 64 is formed on the entire surface of the wafer. Here, Cu (Cu film) is used as the embedded metal 64.

The embedded metal 64 is formed by any one of the methods including a CVD method, an ALD method, a PVD (sputtering) method, a supercritical $CO_2$ method, an electroless plating method, and an electroplating method. In the case of performing the embedding process by the electroplating method or the supercritical $CO_2$ method, a Cu seed film is deposited by, e.g., a sputtering method in the fourth processing apparatus 12D and the embedding process may be performed by a processing apparatus other than the processing system 10.

In this manner, the film forming process is completed. Next, the residual embedded metal 64 or the like on the wafer surface is polished by CMP. Accordingly, a second thin film containing a second metal, e.g., Mn, such as a $MnO_x$ film, can be easily formed on the surface of the insulating layer formed of, e.g., a so-called low-k film having a low relative dielectric constant.

Figure 5:
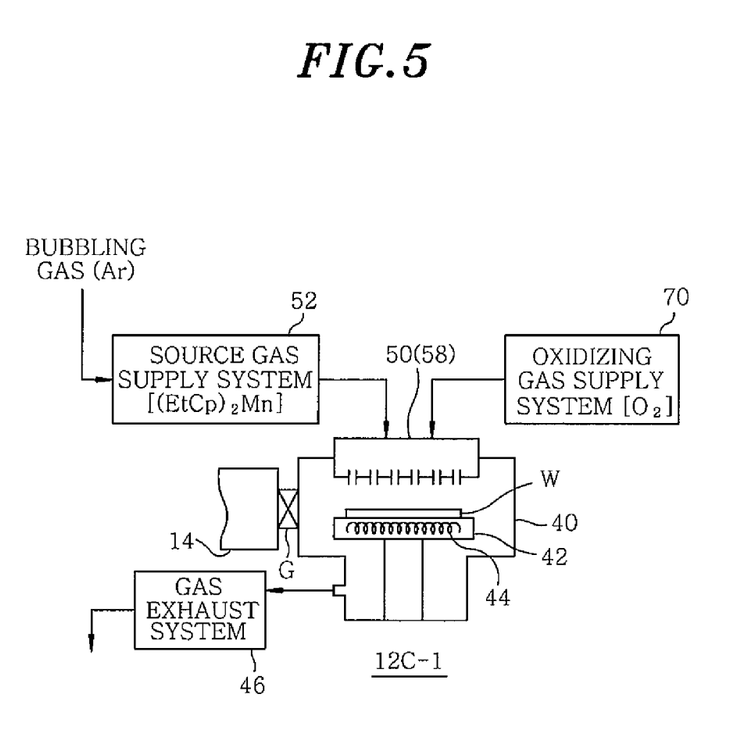
FIG. 5 is a schematic configuration diagram showing a modification of the processing apparatus.

In the processing system shown in FIG. 1, the oxidation step and the second thin film forming step are performed in different processing apparatuses by providing the second and the third processing apparatus 12B and 12C. However, it is also possible to provide a processing apparatus 12C-1 shown in FIG. 5 instead of the two processing apparatuses 12B and 12C and perform the oxidation step and the second thin film forming step consecutively in the single processing apparatus 12C-1. FIG. 5 schematically shows a modification of the third processing apparatus. The third processing apparatus 12C-1 is formed by connecting an oxidizing gas supply system 70 to the shower head 50 in the second processing apparatus 12C described with reference to FIG. 2. In FIG. 5, like reference numerals will be used to refer to like parts in the configuration shown in FIG. 2.

In other words, when the oxidation step is performed in the processing apparatus 12C-1, an oxidizing gas, e.g., $O_2$ gas, is supplied from the oxidizing gas supply system 70. When the second thin film forming step is performed, the Mn source gas is supplied from the source gas supply system 52.

Second Embodiment of the Film Forming Method

Hereinafter, the second embodiment of the film forming method will be described. In the first embodiment described above, the first thin film forming step S1 of forming a Ta film and the oxidation step S2 of forming a $TaO_x$ film by oxidizing the Ta film are performed separately as shown in FIG. 3A. However, as in the second embodiment shown in FIG. 3B, the $TaO_x$ film may be formed in the oxide film forming step as the single step S1-1. Since the $TaO_x$ film is formed by a single step, the sputtering apparatus may perform sputtering while using the $TaO_x$ target as the target. Accordingly, the $TaO_x$ film may be formed by a single step as described above. In that case, the apparatus configuration can be considerably simplified.

Third Embodiment of the Film Forming Method

Next, the third embodiment of the film forming method will be described. In the first embodiment described above, as shown in FIG. 3A, the embedding step S4 is performed after the second thin film forming step S3. However, the embedding step S4 may be performed after the oxidizing step S2 and, then, the second thin film forming step S3 may be performed as in the third embodiment shown in FIG. 3C. By reversing the sequence of the film forming step S3 and the embedding step S4, Mn is diffused in Cu and the $MnO_x$ film may be self-formed on the Cu/Ta interface. In other words, when the source gas is supplied onto the Cu film as the third film, the source gas is decomposed on the Cu surface, and the generated Mn component is diffused in Cu. Accordingly, a $MnO_x$ film (second thin film) is formed on the Cu/Ta interface.

Fourth Embodiment of the Film Forming Method

Figure 3C:
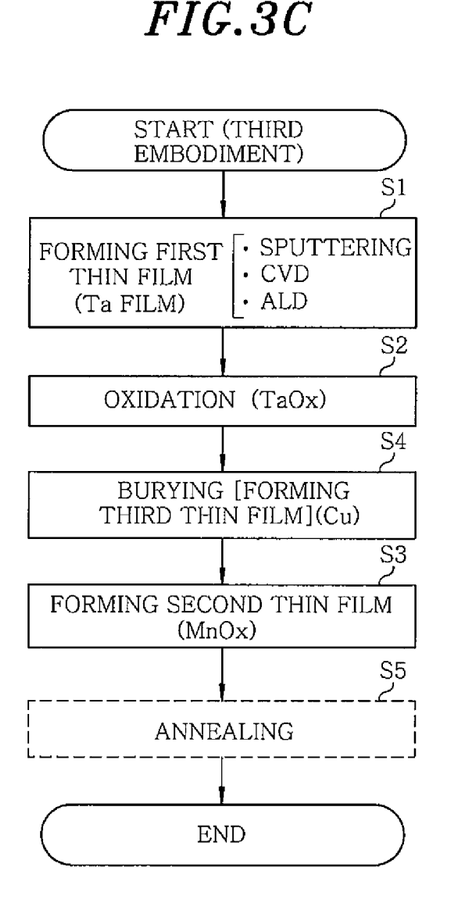
Figure 3D:
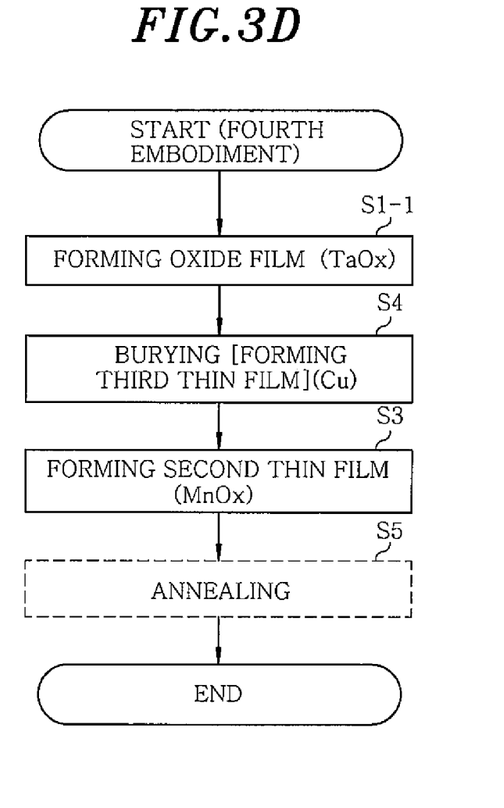
Figure 3E:
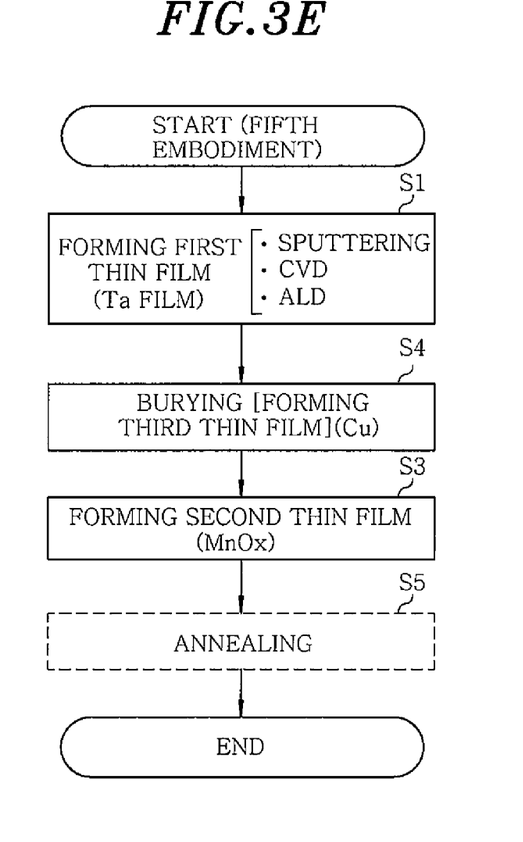

Next, the fourth embodiment of the film forming method will be described. In the third embodiment described above, the first thin film forming step S1 of forming a Ta film and the oxidizing step S2 of forming a $TaO_x$ film by oxidizing the Ta film are separately performed, as shown in FIG. 3C. However, as in the fourth embodiment shown in FIG. 3D, the $TaO_x$ film may be formed in the oxide film forming step as the single step S1-1. In the third and the fourth embodiment, impurities such as carbon or the like which are produced by CVD in the second thin film forming step S3 do not exist in the Cu/Ta interface, so that the adhesivity may be improved. In the third and the fourth embodiment, Mn is diffused in Cu and the $MnO_x$ film is self-formed in the Cu/Ta interface. Thus, the barrier layer is reliably formed. However, the oxide film 60A serves as a virtual barrier layer until the barrier layer is formed, so that Cu is prevented from being diffused toward the insulating film 1.

Fifth Embodiment of the Film Forming Method

Hereinafter, the fifth embodiment of the film forming method will be described. In the third embodiment described above, as shown in FIG. 3C, the first thin film forming step S1 of forming a Ta film is performed and, then, the oxidation step S2 of forming a $TaO_x$ film by oxidizing the Ta film is performed. However, the oxidation step S2 may be omitted, as in the fifth embodiment shown in FIG. 3E. In that case, since the Ta metal is used, the Cu electroplating may be easily performed while using the Ta metal as an electrode. Further, moisture in the electroplating solution or moisture in the insulating film 1 remains around Ta. By performing the second thin film forming step S3 after the electroplating or by performing the annealing step after the second thin film forming step S3, Mn is diffused in Cu and reacts with moisture around Ta when it reaches the Cu/Ta interface. As a result, a $MnO_x$ film is formed on the Cu/Ta interface.

In the first and the second embodiment of the method of the present invention, the annealing step S5 (indicated by dotted lines in FIGS. 3A and 3B) may be additionally performed after the embedding step S4. In the third to the fifth embodiment of the method of the present invention, the annealing step S5 (indicated by dotted lines in FIGS. 3C to 3E) may be additionally performed after the second thin film forming step S3. By adding the annealing step as a final step, the barrier layer having a two-layer structure including the first thin film 60 and the second thin film 62 can be more reliably formed. The annealing step is performed at a processing temperature of about 300° C. to 500° C. in an inert gas atmosphere of, e.g., Ar or $N_2$ for about 0.5 to 10 hours.

In the above embodiments, the case in which the SiOC film is used as a low-k film for forming the insulating layer 1 has been described. However, as for the insulating layer, one or more films selected from a group consisting of a SiOC film, a SiCOH film, a SiCN film, a Silica film, a methylsilsesquioxane film, a polyallylene film, a SiOF film, and a fluorocarbon film may be used. In that case, SiLK (Registered Trademark) may be used for the SiOF film.

In the above embodiments, the case in which Ta is used as the first metal has been described. However, the first metal is not limited thereto and may be one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

In the above embodiments, the case in which Mn is used as a second metal has been described. However, the second metal is not limited thereto and may be one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

In that case, as described above, the first and the second film are selected such that the standard formation free energy of the metal oxide containing the first metal is equal to or greater than that of the metal oxide containing the second metal.

(Evaluation of the Film Forming Method)

Figure 6:
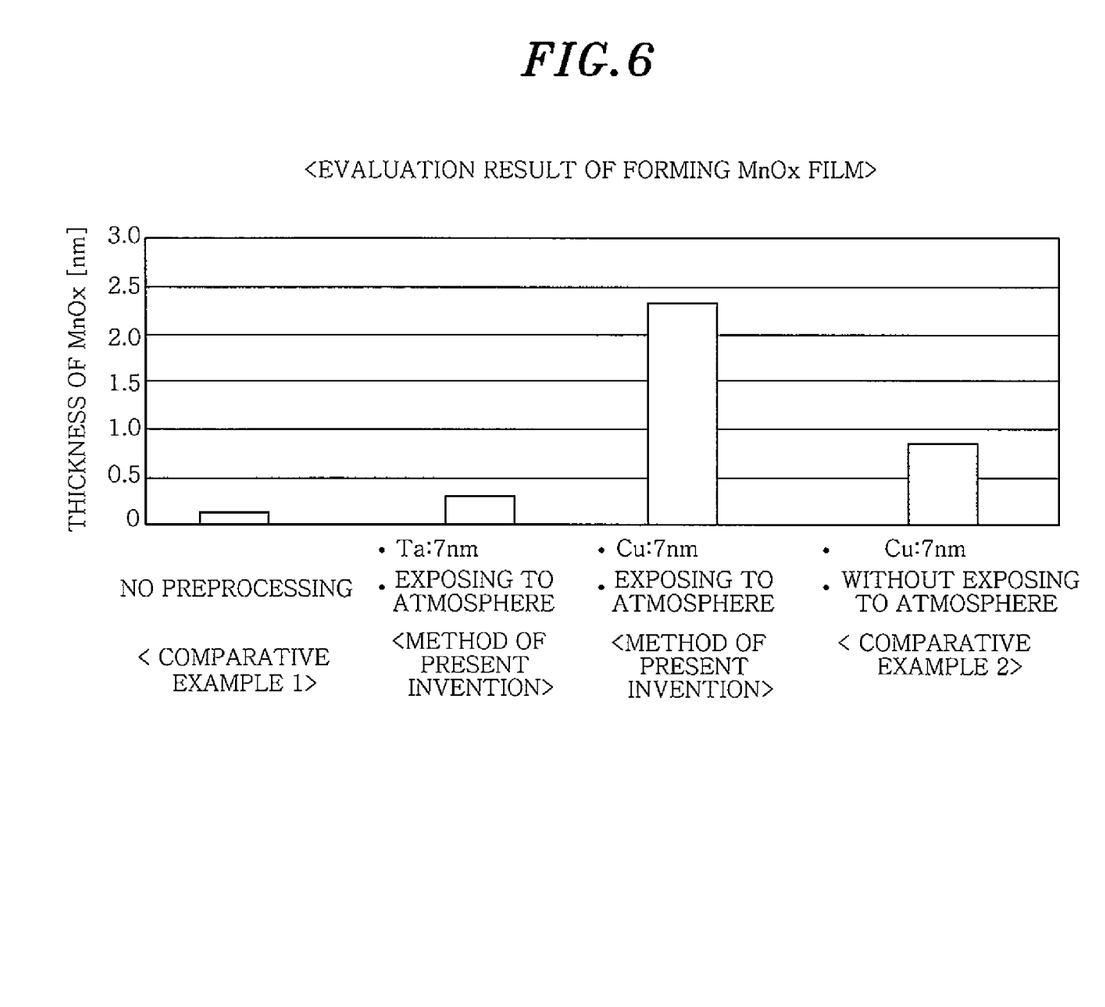
FIG. 6 is a graph showing a result of examining the method of the present invention.

Next, the evaluation results of the film forming method will be described. FIG. 6 is a graph showing the evaluation results obtained in the cases of performing the film forming method. Here, the case of using Ta as the first metal and the case of using Cu as the first metal were evaluated. Further, Mn was used as the second metal in order to form the $MnO_x$ film. Moreover, the exposure to the atmosphere was performed as the oxidation process. In the comparative example 1, the $MnO_x$ film was formed without performing any of the aforementioned processes (preprocesses). In the comparative example 2, the $MnO_x$ film was formed on the Cu film that has not been exposed to the atmosphere. The Ta film and the Cu film were each formed to have the film thickness of about 7 nm. As for the insulating film 1, Black Diamond (Registered Trademark) that is an SiOC film was used. When the $MnO_x$ film is formed, the processing temperature was set to about 200° C.

As shown in FIG. 6, in the case of not performing preprocess, i.e., in the comparative example 1 in which the first thin film 60 is not formed, the film thickness of the $MnO_x$ film is about 0.04 nm, i.e., the $MnO_x$ film is hardly deposited. On the other hand, when Ta or Cu is used as the first metal, the $MnO_x$ film has the film thickness of about 0.3 nm or 2.4 nm, respectively, which is satisfactory. Especially, in the case of using Cu as the first metal, a considerable amount of the $MnO_x$ film was deposited. In the case of using Mn as the second metal, $CuO_x$ can be reduced by Mn whereas $TaO_x$ cannot be reduced by Mn due to the magnitude correlation of the standard formation free energy.

Therefore, the $MnO_x$ film having the film thickness of about 0.3 nm which was obtained in the case of using Ta as the first metal was formed by reaction between water physically adsorbed on the surface of Ta or $TaO_x$ during the exposure to the atmosphere and the Mn source gas. Meanwhile, the $MnO_x$ film having the film thickness of about 2.4 nm which was obtained in the case of using Cu as the first metal was formed by reaction between water physically adsorbed on the Cu or $CuO_x$ surface during the exposure to the atmosphere and the Mn source gas and by reduction of $CuO_x$. The $MnO_x$ film having the film thickness of about 0.9 nm which was formed in the case of performing the film formation on the Cu film that has not been exposed to the atmosphere in the comparative example 2. Since this is the result of the diffusion of Mn in Cu, such case may be ignored (i.e., the $MnO_x$ film preferably has a film thickness of about 1.5 nm (2.4−0.9=1.5 nm)).

Although the semiconductor wafer has been described as an example of the target object in the above embodiments, the semiconductor wafer includes a silicon substrate or a compound semiconductor substrate such as GaAs, SiC, GaN or the like. Further, the present invention may be applied to a ceramic substrate or a glass substrate used for a liquid crystal display without being limited to the above substrates.

What is claimed is:

1. A film forming method for performing a film forming process on a target object, comprising:
    forming, on the target object, an insulating layer having a recess;
    a first process including:
        (i) a first thin film forming step of forming a first thin film containing a first metal and an oxidation step of forming an oxide film by oxidizing the first thin film, or
        (ii) an oxide film forming step of forming the oxide film containing the first metal in a single step;
    a second process including a second thin film forming step of forming a second thin film containing a second metal on the oxide film; and
    a third process including forming a third thin film containing Cu on the second thin film after the second process,
    wherein the oxide film is in direct contact with a surface of the insulating layer in the recess, and
    wherein, in the second process, the second thin film is oxidized by oxygen supplied from the oxide film.

2. The film forming method of claim 1, further comprising a processing step of performing heat treatment after the third thin film forming step of forming the third thin film containing Cu.

3. The film forming method of claim 1, wherein the oxidation step and the second thin film forming step are consecutively performed in a same processing apparatus.

4. The film forming method of claim 1, wherein the insulating layer is formed of one or more films selected from the group consisting of a SiOC film, a SiCOH film, a SiCN film, a silica film, a methylsilsesquioxane film, a polyallylene film, a SiOF film and a fluorocarbon film.

5. The film forming method of claim 4, wherein the insulating layer has a porous structure.

6. The film forming method of claim 1, further comprising a step of physically adsorbing water on a surface of the oxide film containing the first metal.

7. The film forming method of claim 1, wherein a standard formation free energy of a metal oxide containing the first metal is greater than or equal to a standard formation free energy of a metal oxide containing the second metal.

8. The film forming method of claim 1, wherein the first metal is one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

9. The film forming method of claim 1, wherein the second metal is one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

10. The film forming method of claim 1, wherein the second metal is Mn, and an organic metal material containing Mn is one or more materials selected from the group consisting of:
    $MnCp_2[=Mn(C_5H_5)_2]$;
    $Mn(MeCp)_2[=Mn(CH_3C_5H_4)_2]$;
    $Mn(Me_5Cp)_2[=Mn((CH_3)_5C_5H_4)_2]$;
    $Mn(EtCp)_2[=Mn(C_2H_5C_5H_4)_2]$;
    $Mn(i-PrCp)_2[=Mn(C_3H_7C_5H_4)_2]$;
    $Mn(t-BuCp)_2[=Mn(C_4H_9C_5H_4)_2]$;
    $MeCpMn(CO)_3[=(CH_3C_5H_4)Mn(CO)_3]$;
    $CpMn(CO)_3[=(C_5H_5)Mn(CO)_3]$;
    $MeMn(CO)_5[=(CH_3)Mn(CO)_5]$;
    $Mn_2(CO)_{10}$;
    $Mn(DPM)_2[=Mn(C_{11}H_{19}O_2)_2]$;
    $Mn(DPM)_3[=Mn(C_{11}H_{19}O_2)_3]$;
    $Mn(DMPD)(EtCp)[=Mn(C_7H_{11}C_2H_5C_5H_4)]$;
    $Mn(acac)_2[=Mn(C_5H_7O_2)_2]$;
    $Mn(acac)_3[=Mn(C_5H_7O_2)_3]$;
    $Mn(hfac)_2[=Mn(C_5HF_6O_2)_3]$;
    $Mn(iPr-AMD)_2[=Mn(C_3H_7NC(CH_3)NC_3H_7)_2]$;
    $Mn(tBu-AMD)_2[=Mn(C_4H_9NC(CH_3)NC_4H_9)_2]$; and
    $Mn(AMD)_2[=Mn(C_3H_7NC(C_4H_9)NC_3H_7)_2]$.

11. The film forming method of claim 1, the first and the second thin film are formed by any one of methods including a sputtering method, a CVD (Chemical Vapor Deposition) method and an ALD (Atomic Layer Deposition) method.

12. The film forming method of claim 1, wherein the third thin film is formed by any one of methods including a CVD method, an ALD method, a PVD (sputtering) method, a supercritical $CO_2$ method, an electroless plating method, an electroplating method, a CVD-Cu seed and electroplating method, a sputtering Cu seed and electroplating method.

13. The film forming method of claim 1, wherein the oxidation step is performed in a state where the target object is heated.

14. The film forming method of claim 1, wherein the oxidation step is performed without supplying an oxidizing gas.

15. A film forming method for performing a film forming process on a target object, comprising:
    forming, on the target object, an insulating layer having a recess;
    a first process including:
        (i) a first thin film forming step of forming a first thin film containing a first metal, an oxidation step of forming an oxide film by oxidizing the first thin film, and a third thin film forming step of forming a third thin film containing Cu on the oxide film, or (ii) an oxide film forming step of forming an oxide film containing the first metal in a single step and the third thin film forming step of forming the third thin film containing Cu on the oxide film, or (iii) a first thin film forming step of forming a first thin film containing a first metal and the third thin film forming step of forming the third thin film containing Cu on the first thin film; and a second process including a second thin film forming step of forming a second thin film at an interface between the oxide film and the third thin film or between the third thin film and the first thin film by supplying a source gas containing a second metal on the third thin film, wherein the oxide film is in direct contact with a surface of the insulating layer in the recess, and wherein, if the second thin film is formed at the interface between the third thin film and the oxide film, the second thin film is oxidized by oxygen supplied from the oxide film in the second process.

16. The film forming method of claim 15, further comprising a fourth processing step of performing heat treatment after the third thin film forming step of forming the third thin film containing Cu.

17. The film forming method of claim 15, wherein the insulating layer is formed of one or more films selected from the group consisting of a SiOC film, a SiCOH film, a SiCN film, a silica film, a methylsilsesquioxane film, a polyallylene film, a SiOF film and a fluorocarbon film.

18. The film forming method of claim 17, wherein the insulating layer has a porous structure.

19. The film forming method of claim 15, further comprising a step of physically adsorbing water on a surface of the oxide film containing the first metal.

20. The film forming method of claim 15, wherein a standard formation free energy of a metal oxide containing the first metal is greater than or equal to a standard formation free energy of a metal oxide containing the second metal.

21. The film forming method of claim 15, wherein the first metal is one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

22. The film forming method of claim 15, wherein the second metal is one or more metals selected from the group consisting of Mg, Al, Ca, Ti, V, Cr, Mn, Fe, Co, Ni, Cu, Zn, Ga, Ge, Sr, Zr, Nb, Mo, Ru, Rh, Pd, Ag, Cd, In, Sn, Sb, Ba, Hf, Ta, W, Os, Ir, Pt, and Au.

23. The film forming method of claim 15, wherein the second metal is Mn, and an organic metal material containing Mn is one or more materials selected from the group consisting of:

$MnCp_2 [=Mn(C_5H_5)_2]$;
$Mn(MeCp)_2 [=Mn(CH_3C_5H_4)_2]$;
$Mn(Me_5Cp)_2 [=Mn((CH_3)_5C_5H_4)_2]$;
$Mn(EtCp)_2 [=Mn(C_2H_5C_5H_4)_2]$;
$Mn(i\text{-}PrCp)_2 [=Mn(C_3H_7C_5H_4)_2]$;
$Mn(t\text{-}BuCp)_2 [=Mn(C_4H_9C_5H_4)_2]$;
$MeCpMn(CO)_3 [=(CH_3C_5H_4)Mn(CO)_3]$;
$CpMn(CO)_3 [=(C_5H_5)Mn(CO)_3]$;
$MeMn(CO)_5 [=(CH_3)Mn(CO)_5]$;
$Mn_2(CO)_{10}$;
$Mn(DPM)_2 [=Mn(C_{11}H_{19}O_2)_2]$;
$Mn(DPM)_3 [=Mn(C_{11}H_{19}O_2)_3]$;
$Mn(DMPD)(EtCp) [=Mn(C_7H_{11}C_2H_5C_5H_4)]$;
$Mn(acac)_2 [=Mn(C_5H_7O_2)_2]$;
$Mn(acac)_3 [=Mn(C_5H_7O_2)_3]$;
$Mn(hfac)_2 [=Mn(C_5HF_6O_2)_3]$;
$Mn(iPr\text{-}AMD)_2 [=Mn(C_3H_7NC(CH_3)NC_3H_7)_2]$;
$Mn(tBu\text{-}AMD)_2 [=Mn(C_4H_9NC(CH_3)NC_4H_9)_2]$; and
$Mn(AMD)_2 [=Mn(C_3H_7NC(C_4H_9)NC_3H_7)_2]$.

24. The film forming method of claim 15, the first and the second thin film are formed by any one of methods including a sputtering method, a CVD (Chemical Vapor Deposition) method and an ALD (Atomic Layer Deposition) method.

25. The film forming method of claim 15, wherein the third thin film is formed by any one of methods including a CVD method, an ALD method, a PVD (sputtering) method, a supercritical $CO_2$ method, an electroless plating method, an electroplating method, a CVD-Cu seed and electroplating method, a sputtering Cu seed and electroplating method.

26. The film forming method of claim 15, wherein, if the second thin film is formed at the interface between the third thin film and the first thin film, in the second process, the second thin film is oxidized by moisture originating from the third thin film forming step or supplied from the insulating layer.

27. A film forming method for performing a film forming process on a target object, comprising:

forming, on the target object, an insulating layer having a recess;

a first process including:
(i) a tantalum film forming step of forming a tantalum film and an oxidation step of forming a tantalum oxide film by oxidizing the tantalum film, or
(ii) a tantalum oxide film forming step of forming an tantalum oxide film in a single step in a single step;

a second process including a manganese film forming step of forming a manganese film on the tantalum oxide film; and a third process including forming a Cu film on the oxidized manganese film after the second process wherein the tantalum oxide film is in direct contact with a surface of the insulating layer in the recess, and wherein, in the second process, the manganese film is oxidized by oxygen supplied from the tantalum oxide film.

28. The film forming method of claim 27, wherein the oxidation step is performed in a state where the target object is heated.

29. The film forming method of claim 28, wherein the oxidation step is performed without supplying an oxidizing gas.

30. The film forming method of claim 29, wherein, in the second process, the tantalum oxide film is reduced and returned to a tantalum film.

* * * * *